United States Patent [19]
Grewe et al.

[11] Patent Number: 5,694,516
[45] Date of Patent: Dec. 2, 1997

[54] CAPACITIVE INTERFACE FOR COUPLING BETWEEN A MUSIC CHIP AND AUDIO PLAYER

[75] Inventors: Anthony James Grewe, Holmdel; Kevin Alan Shelby, Red Bank, both of N.J.

[73] Assignee: Lucent Technologies Inc., Murray Hill, N.J.

[21] Appl. No.: 447,337

[22] Filed: May 22, 1995

[51] Int. Cl.$^6$ ........................................... G10L 3/02
[52] U.S. Cl. ..................... 395/2.1; 395/2.67; 365/45
[58] Field of Search ........................ 395/2.09, 2.1, 395/2.91, 2.92, 2.79, 2.67, 2.76; 365/45, 48, 49, 50, 1, 2; 235/492, 487, 451, 449; 257/684, 659

[56] References Cited

U.S. PATENT DOCUMENTS

| | | | |
|---|---|---|---|
| 4,717,261 | 1/1988 | Kita et al. | 368/63 |
| 4,772,873 | 9/1988 | Duncan | 341/110 |
| 4,798,322 | 1/1989 | Bernstein et al. | 235/487 |
| 4,963,866 | 10/1990 | Duncan | 341/110 |
| 5,119,172 | 6/1992 | Cho et al. | 357/72 |

Primary Examiner—Tan Dinh

[57] ABSTRACT

A contactless interface for transfer of data between a semiconductor music chip and a solid state audio player. Data is transferred between the chip and audio player by way of a capacitive interface. The interface comprises a set of conductive plates or electrodes with outer dielectric surfaces on both the music chip and the audio player. Corresponding capacitive plates on the music chip and audio player facilitate data communication by forming a series of capacitors once the music chip is inserted within the audio player so that the capacitive plates of each device are aligned and in close proximity with one another. In accordance with one aspect of the invention a set of four capacitive plates is included on both the music chip and the audio player forming four capacitors. In this arrangement, two plates on each device are utilized to transmit data and two plates are utilized to receive data. The data is serially transferred between devices in a differential scheme utilizing differential receive and drive amplifiers. The differential data transfer minimizes transmission errors and makes the audio player less susceptible to noise. Contacts are also provided as part of the interface for transfer of power, ground and clock signals from the audio player to the music chip.

30 Claims, 5 Drawing Sheets

CAPACITIVE INTERFACE FOR COUPLING BETWEEN A MUSIC CHIP AND AUDIO PLAYER

RELATED APPLICATIONS

The present patent application is related to U.S. patent application, Ser. No. 08/447,335, entitled MEMORY CHIP ARCHITECTURE, and having a filing date of May 22, 1995, that application having the same inventors and assignee and being incorporated herein by reference.

FIELD OF THE INVENTION

The present invention relates to an interface between a digital recording medium and an audio player, and more particularly to a capacitive interface between a semiconductor music chip having pre-recorded music stored thereon and an audio player adapted to receive input from said music chip.

BACKGROUND OF THE INVENTION

A variety of recording media exist today for the storage of consumer directed prerecorded music and other audio applications. These media include CD-ROM (Compact Disc Read Only Memory), DAT (Digital Audio Tape) and traditional magnetic cassette audio tape, just to name a few. Of the above technologies, the compact disc format has steadily increased in popularity and gained consumer approval due to the high sound quality of the digitally stored audio, as well as ease of use.

Compact discs, or optical digital discs, as they are sometimes referred, require mechanical drive systems of high accuracy and precise servo-controllers to be used in conjunction with lasers for interfacing with the compact disc and operation of the CD player in playing music. The fact that the disc must be rotated at a constant linear velocity during play requires a substantial number of precision-made movable mechanical parts which tend to fall out of design tolerance due to wear. This and other factors tend to limit the ruggedness and portability of present day CD systems. Moreover, in a manner similar to analog recordings on vinyl discs, it is imperative that the surface of a compact disc be kept clean and free from contaminants in order to obtain faithful reproduction of music and trouble free operation.

The other recording technologies, such as digital audio and cassette tapes, have interfaces with the recording media and the player which may at times also prove disadvantageous. For instance, cassette and digital audio tape technologies actually require physical contact between a magnetic head and the recording medium as the tape travels across the head to read the stored data. This physical contact between the tape and head causes a degradation to the recorded music on the tape and entire system performance over time. Thus, it can be seen, that most, if not all of the present day recording technologies are subject to limitations caused, in some manner, by the interface between the recording media and the audio player.

An emerging technological innovation for the recording of consumer directed audio is the storage of pre-recorded audio on a medium known as semiconductor music chips. Digital data stored on the music chips is accessed by means of a solid state audio player having a digital signal processor which converts the stored digital data into audio signals. Up until recently the storage of digital data for reproduction of popular music albums on a single semiconductor chip was not viable because of the amount of memory needed and the costs associated with same. As data compression techniques have further developed, however, the storage of full length albums on modestly sized semiconductor chips has become a reality. In such a case, where music is digitally encoded on semiconductor memory devices, large quantities of data must be reliably transferred between the music chip and audio player.

Transfer of large quantities of data between semiconductor memory chips or like devices, and processing devices, for example an audio player, could be accomplished utilizing metallic contacts which directly couple one device to another. This approach creates a number of problems which are analogous to the problems of other systems. When metallic contacts are used, eventually there will be increased ohmic resistance that takes place over time due to oxidation on the contact surface. As a result, the accuracy of data transfer between the chip and player will decrease as the ohmic resistance of these contacts increases, thus negatively affecting the sound quality of the reproduced audio. Also any time metallic contacts are exposed, air-borne particles may be caused to deposit on the contact surfaces, decreasing the contact area and causing intermittent connections.

A serious problem associated with the use of metallic contacts as a data transfer interface between a music chip and audio player is the possibility of electrostatic discharge (ESD) occurring which can damage microelectronics on the music chip and in the audio player. Music chips are essentially portable devices that can be transported by a from one audio player to another. High voltages that build up on a person or chip, or that are inadvertently coupled thereto from other sources may very easily be transferred to the electronics of the chip or audio player when metallic contacts are used as the data interface.

SUMMARY OF THE INVENTION

The present invention is a contactless interface for transfer of data between a semiconductor music chip and a solid state audio player. The music chip has pre-recorded audio digitally stored thereon and data is transferred between the chip and audio player by way of a capacitive interface. Thus, the need for exposed electrical contacts in reading data from the music chip is avoided through use of the capacitive interface. The interface comprises a set of conductive plates or electrodes with outer dielectric surfaces on both the music chip and the audio player. Corresponding capacitive plates on the music chip and audio player facilitate data communication by forming a series of capacitors once the music chip is inserted within the audio player so that the capacitive plates of each device are aligned and in dose proximity with one another.

In accordance with one aspect of the invention a set of four capacitive plates is included on both the music chip and the audio player forming four capacitors. In this arrangement, two plates on each device are utilized to transmit data and two plates are utilized to receive data. The data is serially transferred between devices in a differential scheme utilizing differential receive and drive amplifiers. The differential data transfer minimizes transmission errors and makes the audio player less susceptible to noise. Contacts are also provided as part of the interface for transfer of power, ground and clock signals from the audio player to the music chip.

BRIEF DESCRIPTION OF THE FIGURES

For a better understanding of the present invention, reference may be had to the following description of exemplary embodiments thereof; considered in conjunction with the accompanying drawings, in which.

DETAILED DESCRIPTION OF THE DRAWINGS

Figure 1:
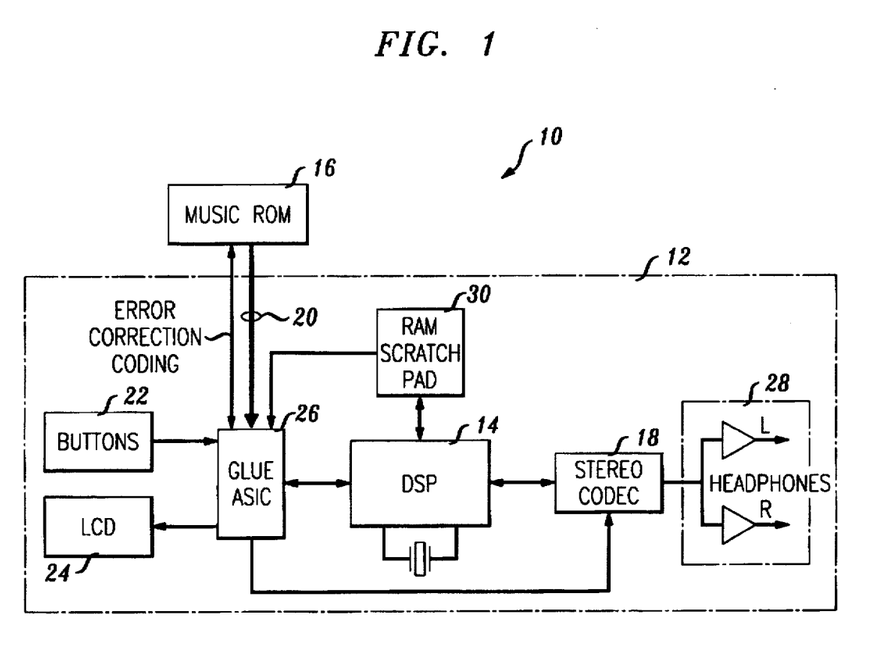
FIG. 1 shows a block diagram for one preferred embodiment of an audio system utilizing the present invention capacitive data interface.

The present invention capacitive interface is utilized for transmission of encoded audio data between a solid state audio player and a digital recording medium having prerecorded music stored thereon, referred to herein as a semiconductor music chip. Referring to FIG. 1, there is shown a block diagram of one preferred embodiment of a solid state audio system 10 which utilizes the present invention capacitive interface 20. The audio system 10 includes an audio player 12 operated by means of a digital signal processor (DSP) 14 and having a music chip 16 coupled thereto by means of the capacitive interface 20. The music chip 16 is essentially a memory device having digital data stored therein which corresponds to pre-recorded music. The pre-recorded audio data is stored in the chip 16 in a compressed format by means of an audio coding algorithm. The algorithm reduces the amount of digital information necessary to be stored from a master recording, while still reproducing essentially the same audio quality when the data is read. Encoding by means of the algorithm is necessary in order to store sufficient quantities of data so that the music on the chip may have a time of play comparable to that of current day albums.

The main hardware architecture of the audio player 12 of FIG. 1 consists of, besides the DSP 14, a stereo coder/decoder (codec) 18, keypad 22, display 24, and associated interface logic in the form of an applications specific integrated circuit (ASIC) 26. The audio player 12 is responsible for decoding the encoded bit stream read from the music chip 16 and outputting the music through an output device such as speakers or headphones 28. Parameters of the PAC algorithm are downloaded into external RAM 30 when a chip 16 is loaded into the player 12 in order to assist in the decoding process.

Figure 2:
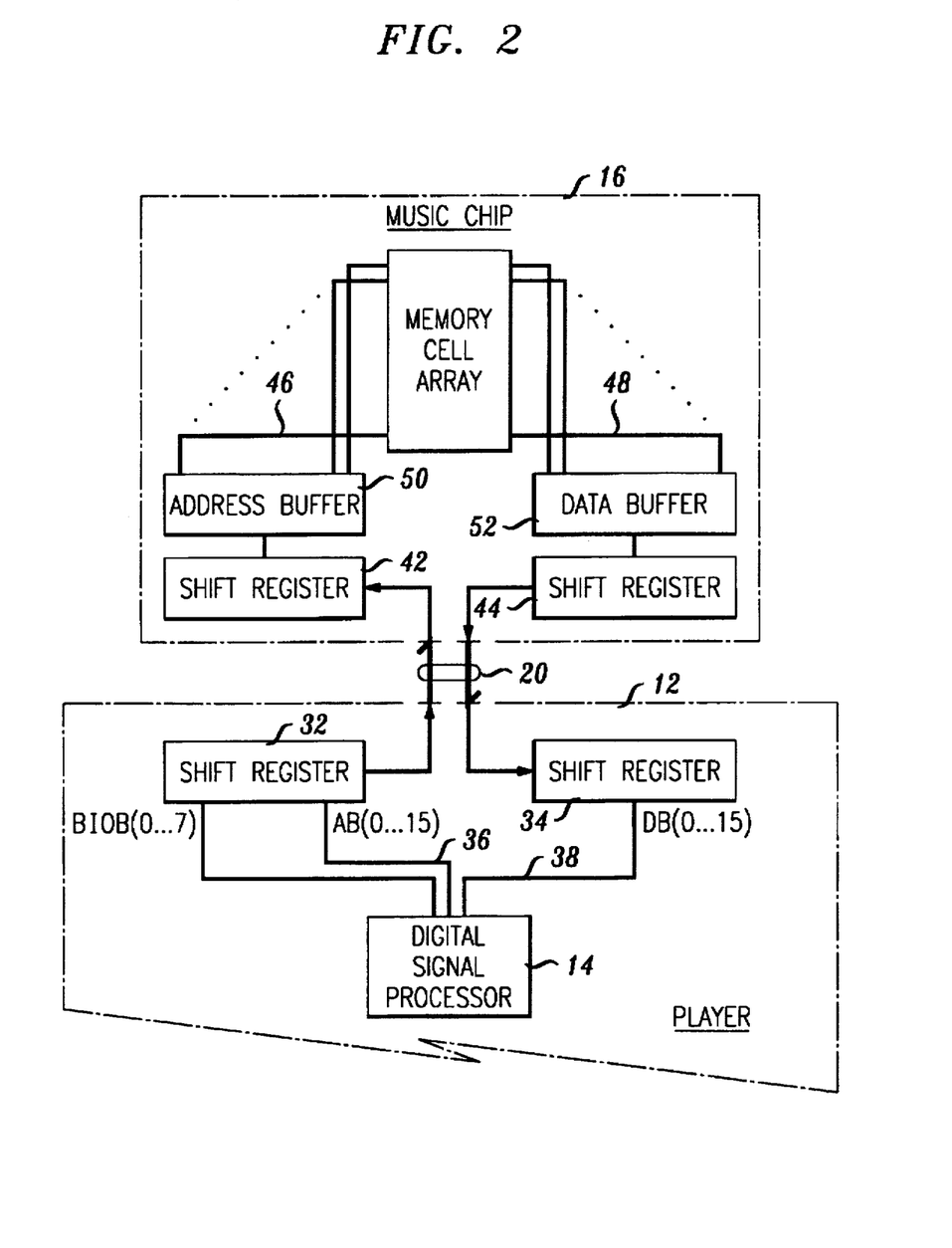
FIG. 2 shows an illustration of data flow between a music chip and audio player which takes place over the present invention capacitive interface.

Referring to FIG. 2, a more detailed illustration is shown of the interface 20 between the music chip 16 and audio player 12. The audio player 12 includes an address shift register 32 and data shift register 34 which are coupled to the DSP 14 over associated address and data buses 36, 38. The music chip 16 includes an array of memory cells 40, for example, ROM, which are coupled to address and data shift registers 42, 44 via respective address and data buses 46, 48, respectively. An address buffer 50 and data buffer 52 are shown interposed between the address shift register 42 and address bus 46 and data shift register 44 and data bus 48 for temporarily storage of information.

In brief, the transfer of information between the music chip 16 and audio player 12 can be described as follows. Address information from the audio player 12 is sent out over the address bus 36 where it is received into the address shift register 32 of the audio player 12. The address shift register 32 is then adapted to output the address information serially over the interface 20 in accordance with the timing and control signals of the DSP 14 to the corresponding address shift register 42 on the music chip 16. The address information is then accessed in parallel form and placed on the address bus 46 where particular memory locations are identified. Data is then read from the specified memory location(s) and placed on the data bus 48 where it is received by the data shift register 44. The data is then shifted out of the shift register 44 and transferred serially over the interface 20 between the chip and player where it is received by the data shift register 34 of the player 12. The information is transferred to the DSP 14 where it is decoded and eventually output as audio. Accordingly, operation of the solid state audio system 10 requires large quantities of data to be transferred at high rates of speed over the data interface 20 between the audio player 12 and music chip 16. Typical data transfer rates range on the order of 150 KHz.

Figure 3:
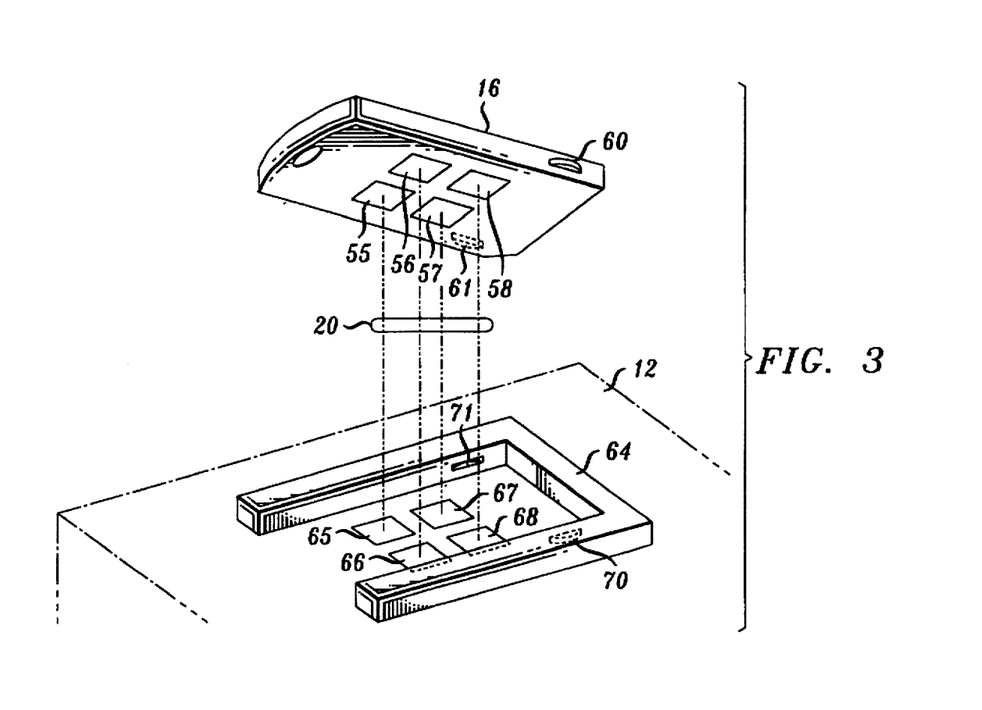
FIG. 3 shows one preferred embodiment of the present invention interface between a music chip and audio player.

Referring to FIG. 3, there is shown one preferred embodiment of the present invention capacitive interface 20 between the between the music chip 16 and solid state audio player 12. An underside view of the chip 16 is shown which depicts a set of four capacitive plates 55–58 for transfer of data between the chip and player. As will be explained two of the capacitive plates are responsible for transfer of data out from the chip while two of the plates receive input data. Contacts 60, 61 on either side of the chip are responsible for providing power, ground and clock signals from the audio player to the chip. The capacitive plates 55–58 and contacts 60, 61 are essentially flush within the housing of the chip so as to minimize protrusions therefrom.

The audio player 12, as will be understood may be a portable or stationary play at home device, and includes one or more receptacle areas 64 which are adapted to receive and hold the music chip 16. A set of four capacitive plates 65–68 which correspond to the capacitive plates 55–58 on the music chip are located within the receptacle area 64. As with the music chip, two plates each on the audio player are adapted to receive data and transfer data. Contacts 70, 71 within the receptacle area are also adapted to mate with the contacts 60, 61 located on the sides of the music chip to provide power and clock signals.

The transfer of addressing information and data to and from the chip 16 to the audio player 12 by means of capacitive plates 55–58 provides a significant advantage over other memory chip packages since the need for exposed electrical contacts is avoided. Conductive plates or electrodes having outer dielectric surfaces on at least one surface of either the chip 16 or the audio player 12 form a series of capacitors which make up the electrical interface when each plate 55–58 in the chip is aligned in close proximity with a corresponding plate 65–68 in the player. When the chip 16 is in place within the audio player 12, addressing information and data are then reliably transferred. This remains true even after some time of use since there are no exposed metal surfaces to corrode or to which particles may collect. In addition, the potential of damage from electrostatic discharge to electronics within the chip 16 is minimized since an insulator in the form of a dielectric is provided between the conductors of the chip and any sources from which the discharge might occur.

Figure 4:
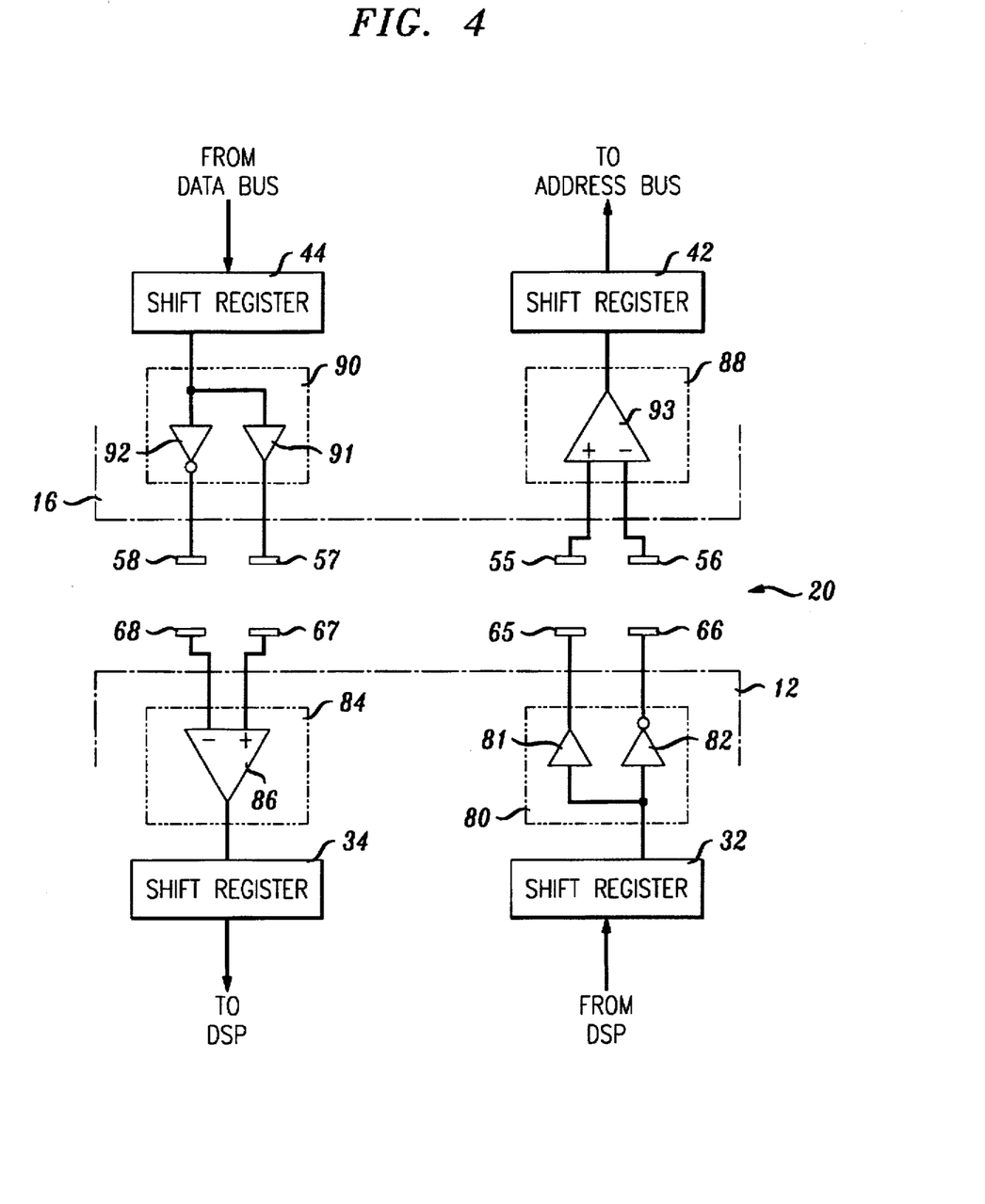
FIG. 4 shows one preferred embodiment for the circuitry of the present invention data interface.

Referring to FIG. 4 in conjunction with FIG. 3, a detailed illustration of the present invention capacitive interface 20 is shown. Beginning with the audio player 12, it can be seen that the address shift register 32 of the audio player is coupled to a data output drive circuit 80. The output drive circuit 80 is comprised of a combination of driver amplifiers 81, 82, wherein one of the driver amplifiers is inverted from the other. The outputs of the driver amplifiers 81, 82 are respectively coupled to capacitive plates 65, 66 located on the exterior of the player. The output drive circuit 80 of the audio player receives serial data from the address shift register 32 and differentially drives the capacitive plates 65, 66, which interface with the capacitive plates 55, 56 of the music chip. These drivers convert the serial data from the shift register 32 which is of one polarity, into a differential polarity such that for each transition of the data from the shift register, one of the drivers goes positive, while the other goes negative.

A data receive circuit 84 is also included in the audio player 12 for receiving data transmitted from the music chip 16. The data receive circuit 84 is comprised of a differential amplifier 86 and is used in receiving differential data coupled to capacitive plates 67, 68 of the player from capacitive plates 57, 58 of the music chip. This data is then received into the data shift register 34 of the audio player where it is then transmitted to the DSP 14 for appropriate processing. Hysterisis is bulk into the data receive circuit 84 such that a differential pulse greater than the hysterisis is required to switch the output of the amplifier 86 from a high state to a low state or from a low state to a high state. The hysterisis aids in preventing outside noise from causing false triggering of the data receive circuit 84 by ignoring small differential noise signals and switching only on larger differential data signals. Accordingly, once the data receive circuit switches states, if there is no further input, it will remain in whatever state it was switched and will not drift back and forth to cause false data indications.

In an analogous fashion to that of the audio player 12, the music chip 16 includes a data receive circuit 88 and a data output drive circuit 90 for communication with the audio player. The data receive circuit 88 is a differential amplifier 93 having inputs coupled to capacitive plates 55, 56 on the music chip. These capacitive plates are capacitively coupled to respective plates 65, 66 on the audio player 12 when the chip 16 is inserted and aligned within the receptacle 64. The output of the data receive circuit 88 on the music chip is coupled to the input of the address shift register 42 which receives the serial addressing information and then outputs that information over the address bus 46.

Similarly, the output driver circuit 90 of the music chip 16 is comprised of opposed driver amplifiers 91, 92 for differentially driving the respective capacitive plates 57, 58 with the serial data received from the data shift register 44 of the music chip. The output capacitive plates 57, 58 on the music chip are coupled to corresponding plates 67, 68 on the audio player 12 which receive the data for processing. Thus, it can be seen that within the set of four capacitive plates located on both the music chip 16 and the audio player receptacle 64, Two of the capacitive plates are utilized for data input of differential data, while two plates are used for data output. The differential data transfer scheme ensures a more reliable transfer of information since two data terminals are active to indicate a transition from one state to another. It will also be understood, however, that other data transfer schemes utilizing different combinations or numbers of capacitive plates may also be employed and that differential data transfer is not necessary for operation of the present invention interface, although it is preferred. Additionally, although individual driver gates and amplifiers are shown, it will be understood that other output and receive circuitry may be utilized to achieve comparable results, as would be known by one having skill in the art.

Although ESD problems are minimized through the use of a contactless data interface, the use of protective diodes to clamp the voltage on the outputs of the data drive circuits 80, 90 and the inputs of the data receive circuits 84, 88 may be included in the both the music chip 16 and the audio player 12. The design of protection circuitry for clamping voltages to safe levels is known and within the capability of those skilled in the art.

Figure 5:
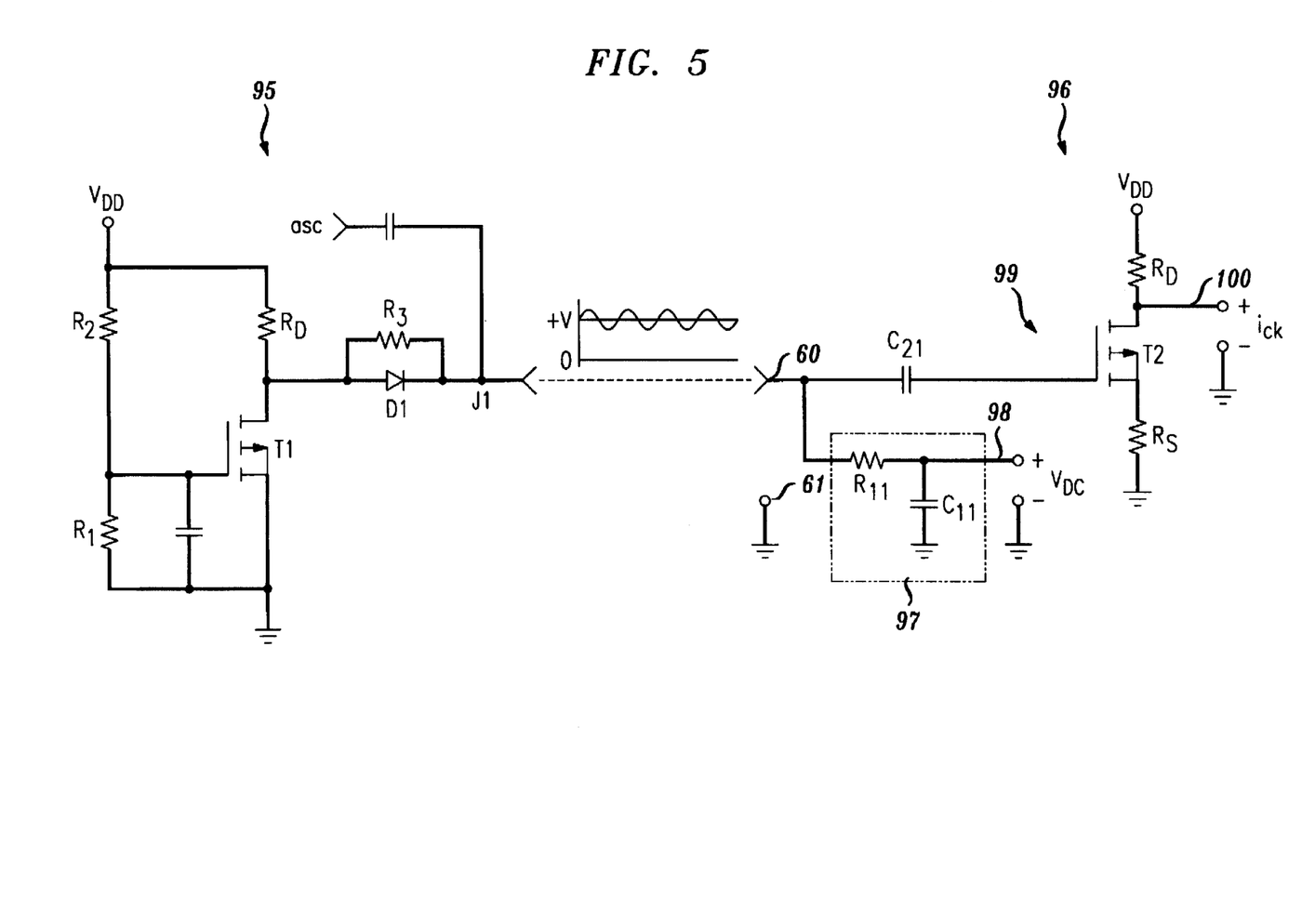
FIG. 5 shows one preferred embodiment of a dc offset circuit and clock recovery circuit used with the present invention.

As has been explained, metallic contacts 60, 61, made for example, from nickel clad copper, are located on either side of the chip 16 to provide power, ground and clock signals to the internal circuitry thereof. Although metal contacts are provided on the chip, the contacts are mounted closely to the body of the chip so as not to protrude a great distance therefrom. This, in combination with surge protection coupled to the circuit lines running from the contacts, reduces the possibility of damage from ESD. In a preferred embodiment of the invention, only two contacts are used to provide power (3.3 VDC), ground and clock signals, wherein the clock signal is transmitted in conjunction with one of the power connections. This is done to reduce susceptibility to ESD by minimizing the exposed contact area, as well as to minimize the effects of corrosion on exposed metal surfaces. Referring to FIG. 5, there are shown preferred embodiments of adc offset circuit 95 and clock recovery circuit 96 used in the audio player 12 and music chip 16, respectively, to transmit the power and clock signals together from one contact. The dc offset circuit 95 includes transistor T1 (MOSFET) which is biased by means of resistive divider network comprised of resistors R1 and R2 and functions to provide a stable dc offset for the voltage output VDD of the audio player 12. The offset signal from the transistor T1 enters a diode-resistive network which prevents bleed-back of the clock signal (OSC) into the power circuit. Diode D1 is forward biased to pass the offset signal. R3 is assigned a relatively large value, for example, one mega-ohm, so as to be able to pass only minimal feedback current. The clock signal (OSC) is added or mixed with the dc offset signal at junction J1 where the clock signal effectively rides on the dc carrier, as shown. Besides providing a stable offset value, the dc offset circuit of FIG. 5 also creates a buffer between the power circuitry and the exposed contact. The values of R1 and R2 are chosen according to the desired offset, wherein typically, R1 is selected to be much greater than R2.

The combination signal is transferred from the audio player 12 to the music chip 16 through one of the metal contacts 60, 61, wherein the clock is extracted from the power signal by means of a clock-VDC recovery circuit 96. The VDC recovery circuit is comprised of a low pass filter 97 including R11, C11, R11 and C11 integrate the input signal over time to produce a dc signal, wherein VDC appears at the output terminal 98 of the low pass filter 97. The clock recovery circuit 99 includes amplifying transistor T2 which is driven into enhancement or depletion mode by the ac clock signal. Capacitor C21 blocks the dc portion of the combination signal and the extracted clock signal appears at an output terminal 100 which is coupled to the drain of transistor T2. Depending on the clock frequency utilized, R11, C11 and RD, RS are chosen so that RD is much greater than RS. It will be understood that in the alternative, three contacts may be provided for the transfer of each of the signals individually. As is known in the art, data transfer is coordinated throughout the music chip 16 and audio player 12 by means of the clock and other corresponding signals which are issued from the DSP.

A unique interface for transfer of digital data between a semiconductor chip music and associated audio player has thus been presented. The interface allows for serial transfer of data to and from the chip by means of a capacitive interface to the audio player, that eliminates the need for metal contacts. The interface, which utilizes differential data transfer, is extremely reliable and aids in protecting the microelectronics within the chip and audio player from damage caused by handling.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. An interface arrangement for contactless transfer of data between a semiconductor music chip having compressed data representative of audio signals stored thereon, and a solid state audio player having a receptacle area, said interface arrangement comprising:
   a first plurality of plates disposed on said interface area of said music chip; and
   a second plurality of plates disposed on a receptacle area of said audio player, said second plurality of plates being aligned with said first plurality of plates when said music chip is inserted within said receptacle area, to thereby form a capacitive coupling over which data is transferred within each pair of aligned plates.

2. The interface of claim 1, wherein at least one plurality of exposed exterior facing surfaces of said first and second plurality of plates includes a layer of dielectric material disposed thereon.

3. The interface of claim 1, further including means for differentially transferring data from said audio player to said music chip and from said music chip to said audio player, said means being coupled to said first and second plurality of plates.

4. The interface of claim 3, wherein said means for differentially transferring data includes a first and second set of output drivers disposed respectively on said music chip and said audio player for transmitting data, wherein respective outputs of said output drivers are coupled to first and second plates of said first and second plurality of plates.

5. The interface of claim 4, wherein said means further includes first and second differential amplifiers disposed respectively on said music chip and audio player for receiving data, wherein respective input terminals of said differential amplifiers are coupled to third and fourth plates of said first and second plurality of plates.

6. The interface of claim 4, wherein said means for differentially transferring data includes a first and second shift register means disposed respectively in said music chip and said audio player, wherein input terminals of said first and second set of output drivers are coupled to respective outputs of said first and second shift register means to thereby receive serial data therefrom.

7. The interface of claim 5, wherein output terminals of said differential amplifiers are coupled to respective shift register means for receiving serial data therefrom.

8. The interface of claim 1, wherein said first and second plurality of plates comprises a series connection between said music chip and audio player, said series connection being adapted for the transfer of serial data.

9. The interface of claim 1, further including means for transfer of power, ground and clock signals from said audio player to said music chip.

10. In an audio system for use with portable semiconductor music chips having compressed encoded digital data representative of audio signals stored thereon, and a solid state audio player including digital signal processing means, a data transfer means for enabling contactless communication between said music chip and said audio player comprising:
   input/output means for communicating with at least one portable music chip, said input output means being operably connected to and communicating with said digital signal processing means; and
   capacitive coupling means for transferring data between said music chip and said audio player, said input/output means and capacitive coupling means providing a communications interface between said music chip and player.

11. The data transfer means of claim 10, wherein said capacitive coupling means comprises a series connection between said audio player and said music chip, said series connection being adapted for the transfer of serial data and being formed upon bringing into alignment in close proximity electrodes disposed on said audio player and music chip.

12. The data transfer means of claim 11, wherein at least one of two electrodes brought into alignment has a dielectric material affixed thereto.

13. The data transfer means of claim 10, further including means for differentially transferring data from said audio player to said music chip and from said music chip to said audio player, said means being coupled to said capacitive coupling means.

14. The data transfer means of claim 13, wherein said means for differentially transferring data includes a first and second set of output drivers disposed respectively on said music chip and said audio player for transmitting data, wherein respective outputs of said output drivers are coupled to said capacitive coupling means on said chip and player, and wherein said means further includes first and second differential amplifiers disposed respectively on said music chip and audio player for receiving data, wherein respective input terminals of said differential amplifiers are coupled to said capacitive coupling means on said chip and player.

15. The data transfer means of claim 10, further including means for transfer of power, ground and clock signals from said audio player to said music chip.

16. The data transfer means of claim 10, wherein said audio player includes at least one receptacle slot adapted to receive a music chip and align said capacitive coupling means.

17. In an audio system, wherein pre-recorded audio is digitally stored on semiconductor music chips adapted for insertion into an associated audio player, a capacitive interface for transfer of data between said music chip and said audio player, said capacitive interface comprising:
   at least one insulated metallic plate disposed on a surface of said music chip,
   at least one corresponding metallic plate disposed on a surface of said audio player which is adapted to receive said music chip, wherein said at least one insulated metallic plate and said at least one corresponding plate align in close proximity upon insertion of said music chip, thereby creating a capacitive coupling for transfer of data between said chip and player.

18. The interface of claim 16, wherein said capacitive coupling comprises a series connection between said audio player and said music chip, said series connection being adapted for the transfer of serial data.

19. The interface of claim 17, further including means for differentially transferring data from said audio player to said music chip and from said music chip to said audio player, said means being coupled to said metallic plates.

20. The interface of claim 17, further including at least one receptacle means disposed on said audio player, said receptacle means being adapted to receive said music chip and facilitate alignment of said metallic plates.

21. An interface arrangement for a semiconductor music chip having encoded digital data representative of audio signals stored thereon which permits data transfer to a solid state audio player having a receptacle area with a mating interface, comprising:
   a first plurality of dielectric plates disposed on said music chip in mating alignment with similarly disposed plates on said receptacle area, and
   a layer of dielectric material disposed on facing exterior surfaces of said first plurality of dielectric plates so as to form a contactless data transfer conduit between said chip and said player.

22. The interface arrangement of claim 21, wherein said contactless data transfer conduit comprises a series connection between said audio player and said music chip, said series connection being adapted for the transfer of serial data.

23. The interface arrangement of claim 21, wherein said data transfer conduit includes means for differentially transferring data from said audio player to said music chip and from said music chip to said audio player.

24. The interface of claim 9, further including means for transfer of said power and clock signals to said music chip over a single contact, said music chip including means for recovery of each of said power and clock signals.

25. A data transfer apparatus for transfer of serial data between a semiconductor music chip having encoded data indicative of prerecorded music stored thereon and an audio player adapted to decode said encoded data and output said prerecorded music, said apparatus comprising:
   input address shift register disposed on said audio player for receiving address data generated from said audio player and serially outputting said address data;
   first and second output drivers coupled to said input address shift register adapted to differentially output said address data received from said input address shift register;
   first differential amplifier disposed on said music chip adapted to receive said address data that is differentially output from said first and second output drivers;
   output address shift register coupled to said first differential amplifier for serially receiving said address data from said differential amplifier;
   first set of plates coupled to output terminals of said first and second output drivers and a second set of plates coupled to input terminals of said first differential amplifier, wherein said first and second set of plates are alignable in close proximity to thereby capacitively couple said output terminals of said output drivers to said input terminals of said first differential amplifier;
   input data shift register disposed on said music chip for receiving stored data from said music chip and serially outputting said stored data;
   third and fourth output drivers coupled to said input data shift register adapted to differentially output said stored data received from said input data shift register;
   second differential amplifier disposed on said audio player adapted to receive said stored data that is differentially output from said third and fourth output drivers;
   output data shift register coupled to said second differential amplifier for serially receiving said stored data from said differential amplifier; and
   third set of plates coupled to output terminals of said third and fourth output drivers and a fourth set of plates coupled to input terminals of said second differential amplifier, wherein said third and fourth set of plates are alignable in close proximity as said first and second set of plates to thereby capacitively couple said output terminals of said third and fourth output drivers to said input terminals of said second differential amplifier.

26. The apparatus of claim 25, wherein said music chip is adapted to receive adc power, ground and clock signal from said audio player, said music chip including first and second contacts adapted to couple with corresponding contacts on said audio player, wherein said dc power and clock signal are transferred in combination with one another over a single one of said contacts, said chip apparatus including means for recovery of said dc power and clock signals.

27. The apparatus of claim 26, wherein said means for recovery includes a low pass filter for recovering said dc power signal and a dc current blocking means coupled to a transistor amplifier for recovery of said clock signal.

28. The apparatus of claim 26, wherein said audio player includes means for producing adc offset signal and mixing means coupled thereto for mixing said clock signal with said dc offset signal to thereby produce a composite signal for transfer over said single contact.

29. A contactless data transfer arrangement between a semiconductor music chip having digital data representative of prerecorded music stored thereon and an audio player adapted to interpret said digital data and output said prerecorded music, said arrangement comprising:
   a semiconductor music chip having a first plurality of capacitive plates mounted essentially flush on a single surface thereof;
   at least one chip receptacle disposed on said audio player adapted to receive said music chip, said receptacle including a second plurality of corresponding capacitive plates adapted to align in close proximity with said first plurality of capacitive plates of said music chip when said music chip is inserted within said receptacle, thereby creating a capacitive coupling between said music chip and said receptacle of said audio player for contactless transfer of data, wherein at least two of said first and second plurality of capacitive plates couple together to enable the differential transfer of addressing information from said audio player to said music chip and at least another two of said first and second plurality of capacitive plates couple together to enable the differential transfer of data between said music chip and audio player, said music chip further including,
   a plurality of metallic contacts adapted to mate with corresponding contacts in said receptacle, said contacts adapted to provide a predetermined voltage, ground and clock signal to said music chip.

30. The arrangement of claim 29, wherein said plurality of contacts include a first and second contact adapted to transfer said voltage, ground and clock signals to said music, wherein said clock signal is transferred in combination with said voltage signal over a single contact and said voltage and clock signals are recovered in said music chip by means of a recovery circuit.

* * * * *